(12) United States Patent
Fujii (10) Patent No.: US 6,730,981 B2
(45) Date of Patent: May 4, 2004

(54) BIPOLAR TRANSISTOR WITH INCLINED EPITAXIAL LAYER

(75) Inventor: Hidenori Fujii, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/286,754

(22) Filed: Nov. 4, 2002

(65) Prior Publication Data

US 2003/0230788 A1 Dec. 18, 2003

(30) Foreign Application Priority Data

Jun. 14, 2002 (JP) ........................ 2002-174101

(51) Int. Cl.[7] ........................ H01L 29/00; H01L 27/082
(52) U.S. Cl. ........................ 257/526; 257/527; 257/557; 257/558; 257/585; 257/586
(58) Field of Search ................ 257/526, 527, 257/517, 557, 558, 585, 586, 593, 559, 583, 545, 197, 198, 192, 194, 195, 280, 15, 20, 24, 190, 281

(56) References Cited

U.S. PATENT DOCUMENTS 5,843,828 A * 12/1998 Kinoshita .................... 438/367

2001/0022386 A1 9/2001 Sato

FOREIGN PATENT DOCUMENTS

JP 2001-267326 9/2001

* cited by examiner

Primary Examiner—Minhloan Tran
Assistant Examiner—Tan Tran
(74) Attorney, Agent, or Firm—Leydig, Voit & Mayer, Ltd.

(57) ABSTRACT

In an element formation region, a surface of an $N^-$ epitaxial layer is inclined upward from an end of a field oxide film to a sidewall of an opening. An external base diffusion layer at the surface of the $N^-$ epitaxial layer is inclined upward from a side of the field oxide film to the sidewall of the opening, and is exposed at the sidewall of the opening. A portion of the sidewall of the opening exposing the external base diffusion layer is tapered. The depth of a lower end of the external base diffusion layer or the sidewall of the opening is substantially equal to or smaller than that of a bottom of the opening. A decrease in breakdown voltage between an emitter and a base is suppressed, and decrease and variation of current gain hFE is suppressed.

8 Claims, 11 Drawing Sheets

BIPOLAR TRANSISTOR WITH INCLINED EPITAXIAL LAYER

BACKGROUND OF THE INVENTION

1. Field of the Invention

The present invention relates to a semiconductor device and, more specifically, to a semiconductor device including a bipolar transistor.

2. Description of the Background Art

Figure 15:
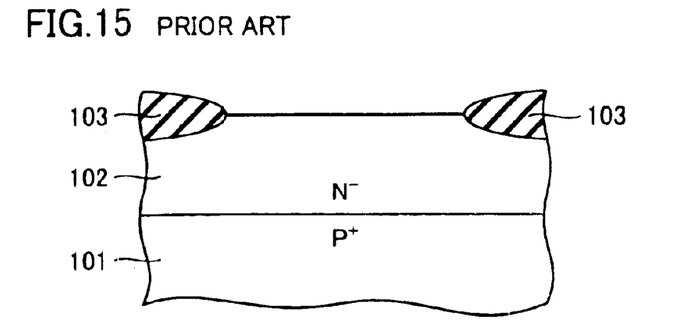
FIGS. 15–25 are cross-sectional-views showing successive steps in a method of manufacturing a conventional semiconductor device.

A method of manufacturing a conventional semiconductor device including a bipolar transistor will now be described. First, as shown in FIG. 15, an N⁻ epitaxial layer 102 is formed on a semiconductor substrate 101. A field oxide film 103 is formed on N⁻ epitaxial layer 102.

A polysilicon film (not shown) is formed on semiconductor substrate 101 by CVD (Chemical Vapor Deposition) covering an element formation region of semiconductor substrate 101 separated by field oxide film 103.

Figure 16:
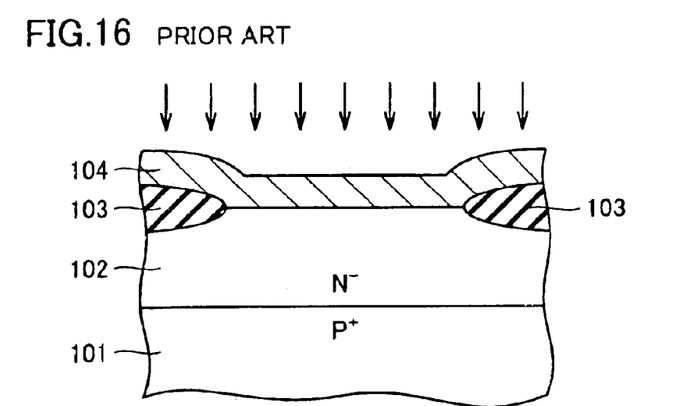

Thereafter, a prescribed impurity to form an external base diffusion layer is implanted into the polysilicon film as shown in FIG. 16. An external base leading electrode 104 is formed by prescribed etching of the polysilicon film.

Figure 17:
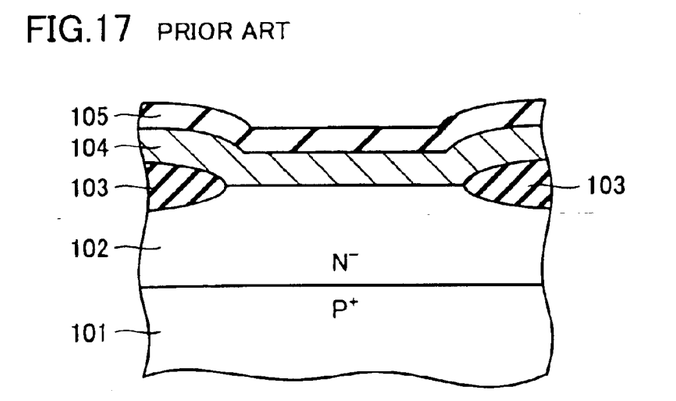
Figure 18:
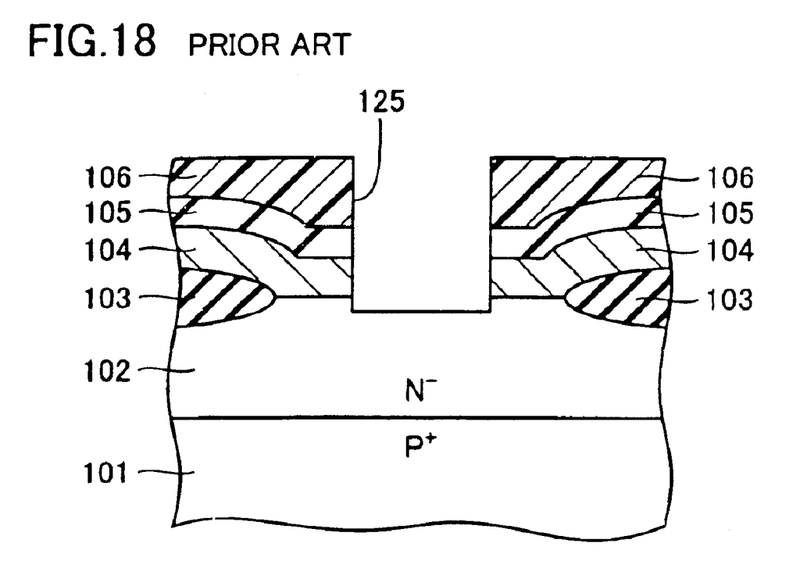

As shown in FIG. 17, a silicon oxide film 105 is formed on semiconductor substrate 101 by CVD covering external base leading electrode 104. Then, as shown in FIG. 18, a resist pattern 106 is formed on silicon oxide film 105.

An opening 125 to be a base region is formed by anisotropic etching of silicon oxide film 105 and external base leading electrode 104 using resist pattern 106 as a mask. During this step, a surface portion of N⁻ epitaxial layer 102 is etched to some extent.

Figure 19:
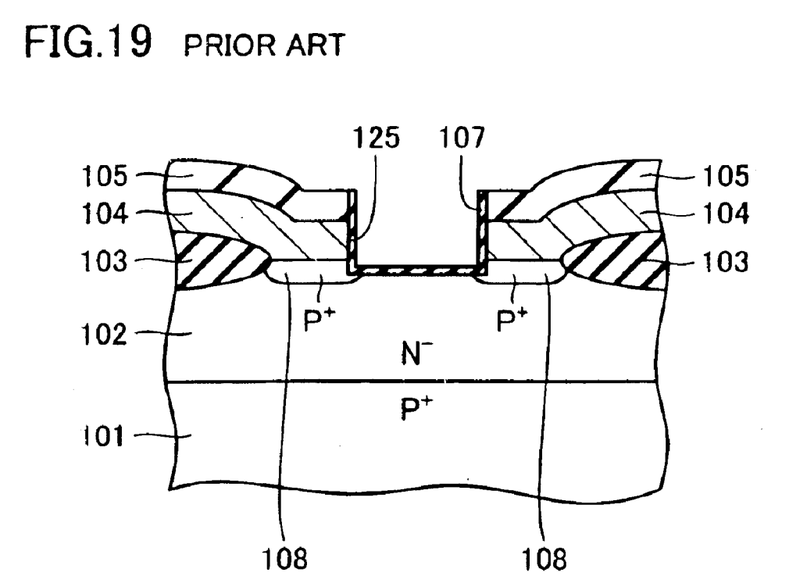

As shown in FIG. 19, by an oxidation, impurity implanted into external base leading electrode 104 is diffused from a surface of N⁻ epitaxial layer 102 to the inside, and an external base diffusion layer 108 is formed. In this step, a relatively thin silicon oxide film 107 is formed on a region such as an exposed surface region of N⁻ epitaxial layer 102.

Figure 20:
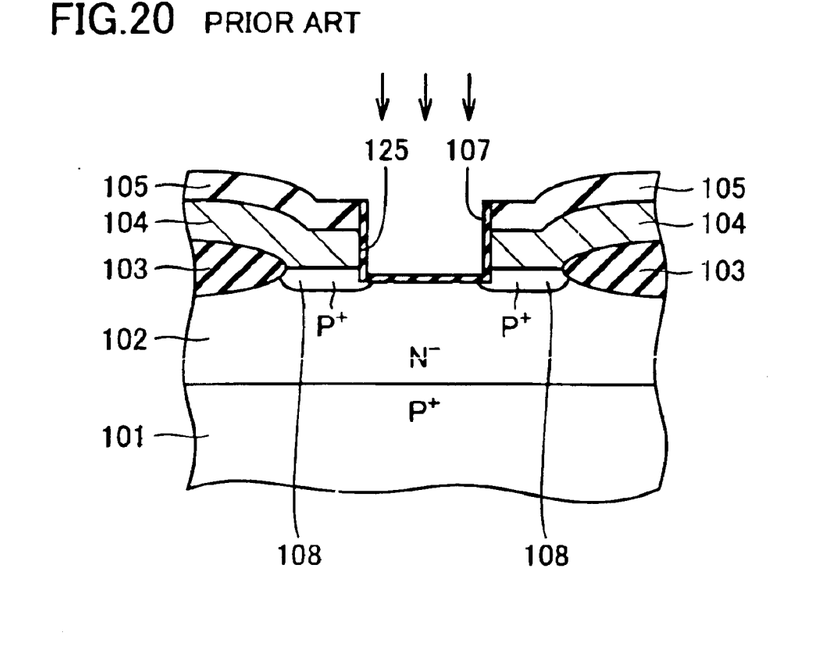
Figure 21:
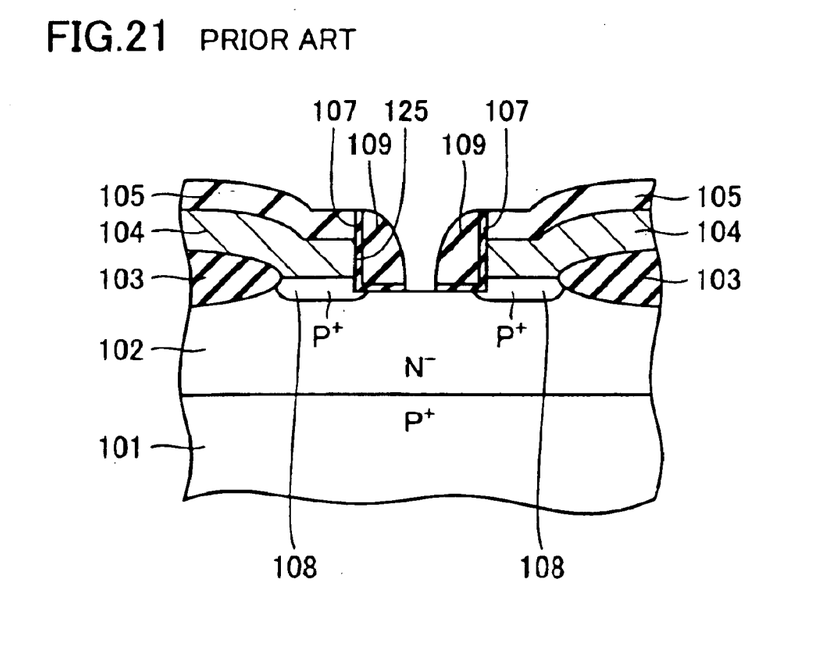

Thereafter, as shown in FIG. 20, a prescribed impurity to form an intrinsic base diffusion layer is implanted into N⁻ epitaxial layer 102 as an intrinsic base implantation. Then, a silicon oxide film (not shown) is formed on silicon oxide film 105 with the CVD method. By performing anisotropic etching of the silicon oxide film and exposing the surface of N⁻ epitaxial layer 102, a sidewall oxide film 109 is formed as shown in FIG. 21.

Figure 22:
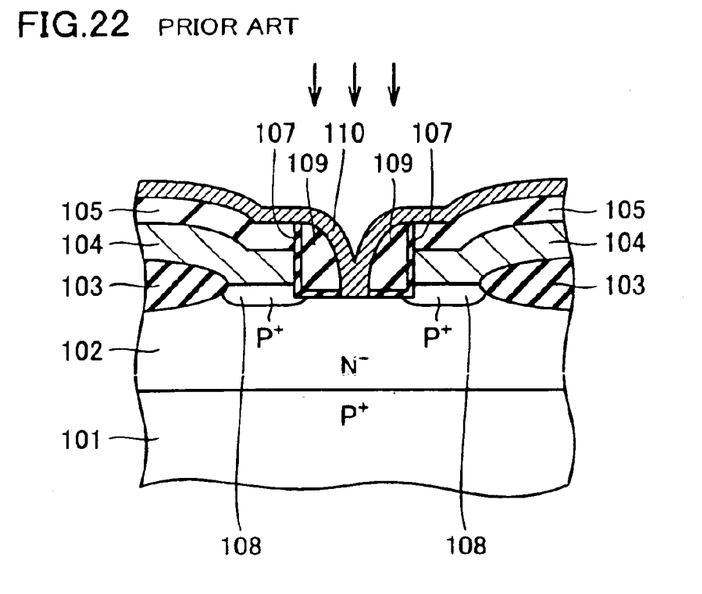

As shown in FIG. 22, a polysilicon film 110 (or an amorphous silicon film) is formed on silicon oxide film 105 with the CVD method. Then, a prescribed impurity to form an emitter diffusion layer is implanted into polysilicon film 110 as an emitter implantation.

Figure 23:
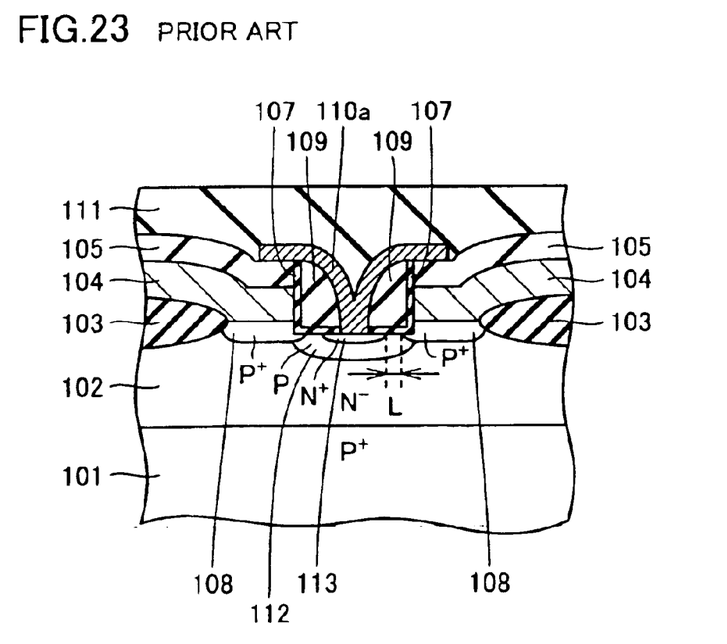

As shown in FIG. 23, an emitter leading electrode 110a is formed by a prescribed patterning of polysilicon film 110. An interlayer silicon oxide film 111 is formed with the CVD method so as to cover emitter leading electrode 110a.

Thereafter, the impurity implanted as the intrinsic base implantation is diffused by a heat treatment to form an intrinsic base diffusion layer 112. The impurity implanted as the emitter implantation is diffused to form an emitter diffusion layer 113.

Figure 24:
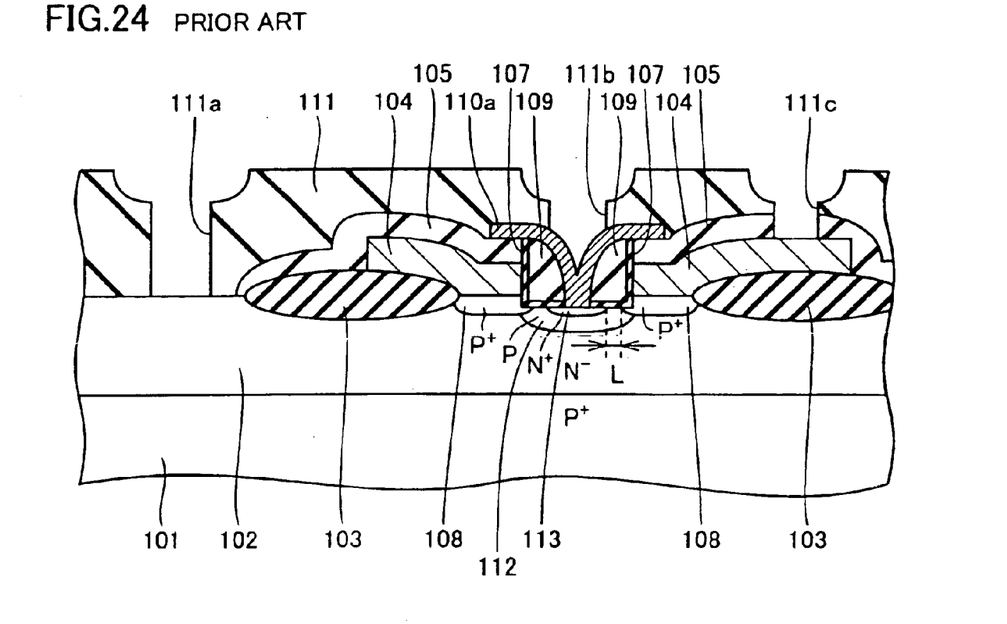

As shown in FIG. 24, prescribed contact holes 111a–111c are respectively formed by prescribed etching of interlayer silicon oxide film 111. Then, an aluminum film (not shown) is formed with sputtering, for example, to fill contact holes 111a–111c.

Figure 25:
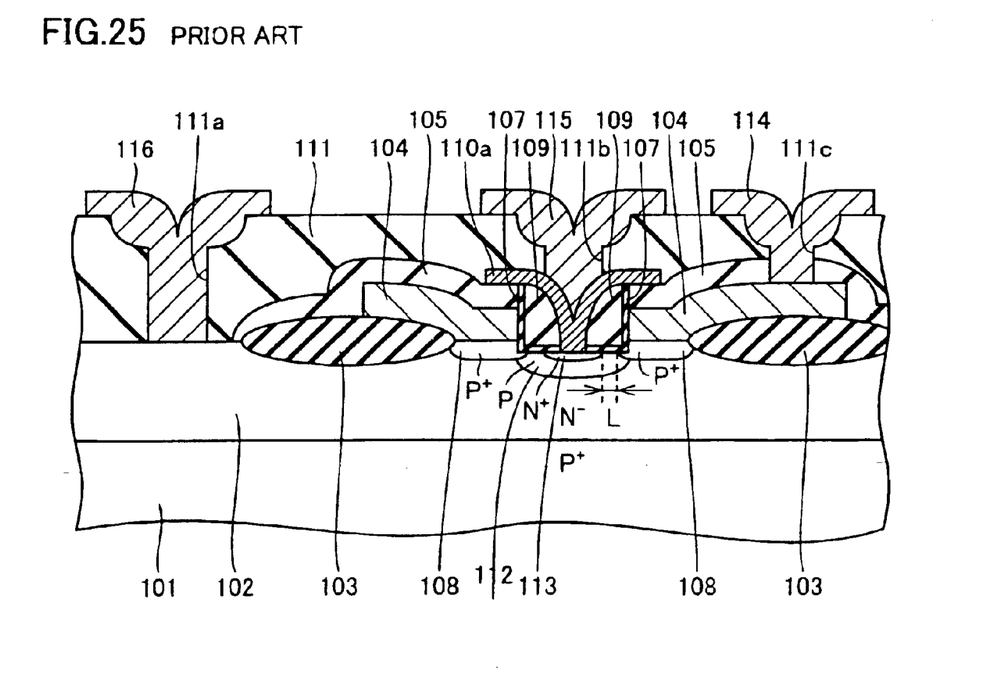

As shown in FIG. 25, a collector electrode 116, a base electrode 114 and an emitter electrode 115 are respectively formed by a prescribed patterning of the aluminum film. As a result, a semiconductor device including a bipolar transistor T is formed.

The conventional semiconductor device has, however, problems as follows. Intrinsic base diffusion layer 112 is formed in the step shown in FIG. 23 by a heat treatment of the prescribed impurity which was implanted into N⁻ epitaxial layer 102 in the step shown in FIG. 20.

To ensure an electrical connection between intrinsic base diffusion layer 112 formed as such and external base diffusion layer 108, it is necessary to diffuse the impurity for external base diffusion layer 108 to a deeper region of semiconductor substrate 101, and to make the etched amount (removed amount) of the surface portion of N⁻ epitaxial layer 102 as small as possible when opening 125 for the base region is formed.

In the step shown in FIG. 19, on the other hand, when the impurity for external base diffusion layer 108 is to be diffused to a deeper region of N⁻ epitaxial layer 102 by a heat treatment while making small the removed amount of the surface portion of N⁻ epitaxial layer 102 located on the bottom of opening 125, the impurity will also be diffused to a lateral (horizontal) direction.

That is, the impurity will be diffused toward a portion of N⁻ epitaxial layer 102 located near a center of the bottom of opening 125, as well as toward a portion of N⁻ epitaxial layer 102 located directly below field oxide film 103.

Particularly, when the impurity is diffused toward the portion of N⁻ epitaxial layer 102 located near the center of the bottom of opening 125, a distance L between external base diffusion layer 108 and emitter diffusion layer 113 becomes smaller as shown, for example, in FIG. 23. As a result, breakdown voltage between the emitter and base decreases.

In addition, an injection efficiency of the emitter decreases in a portion around emitter diffusion layer 113, and a current gain hFE decreases when the distance L becomes smaller.

Furthermore, an impurity concentration in intrinsic base diffusion layer 112 around emitter diffusion layer 113 is affected by the distance L between external base diffusion layer 108 and emitter diffusion layer 113 depending on the size of the bipolar transistor. Consequently, an injection efficiency of electrons and the current gain hFE vary around emitter diffusion layer 113.

SUMMARY OF THE INVENTION

The present invention is made to solve the above-described problems. An object of the present invention is to provide a semiconductor device which suppresses decrease in breakdown voltage between an emitter and a base and suppresses decrease and variation of current gain hFE.

A semiconductor device according to the present invention includes an element formation region formed on a main surface of a semiconductor substrate of a first conductivity type, an insulator film, an opening, a first conductive material portion, a first impurity region of a first conductivity type, a second conductive material portion, a second impurity region of a second conductivity type, and a third impurity region of a second conductivity type. The element formation region formed on the main surface of the semiconductor substrate is separated by an element isolation insulator film. The insulator film is formed on the semiconductor substrate so as to cover the element formation region.

The opening is formed in the insulator film and the element formation region, and has a sidewall and a bottom exposing a region of the semiconductor substrate located approximately on the center portion of the element formation region. The first conductive material portion is formed between the semiconductor substrate and the insulator film, and extends from a side of the element isolation insulator film to the opening and is exposed at the sidewall of the opening. The first impurity region of the first conductivity type is formed on a surface portion of the semiconductor substrate exposed at the bottom of the opening. The second conductive material portion is electrically connected to the first impurity region. The second impurity region of the second conductivity type is formed on the semiconductor substrate so as to enclose the first impurity region from side and bottom, and to include the surface portion of the semiconductor substrate exposed at the bottom of the opening. The third impurity region of the second conductivity type is formed on a surface portion of the semiconductor substrate within the element formation region, extends from a side of the element isolation insulator film to the opening and is exposed at the sidewall of the opening, and is electrically connected with the second impurity region. The surface portion of the semiconductor substrate within the element formation region is inclined substantially upward from the side of the element isolation insulator film to the sidewall of the opening.

In a bipolar transistor having the first impurity region as an emitter, the second and third impurity regions as a base, and the semiconductor substrate of the first conductivity type as a collector according to this structure, because the surface portion of the semiconductor substrate is inclined substantially upward from the side of the element isolation insulator film to the sidewall of the opening, a sufficient distance between the portion of the third impurity region located on the side of the sidewall of the opening and the first impurity region located on the bottom of the opening is ensured, as compared with a conventional semiconductor device without such inclination when the third impurity region is formed by diffusing the impurity of the second conductivity type implanted into the first conductive material portion to the portion of the semiconductor substrate within the element formation region. As a result, sufficient breakdown voltage of the first impurity region (emitter) and the third impurity region (base) can be ensured. In addition, when the second impurity region is formed by diffusing the impurity of the second conductivity type, which impurity is introduced to the surface portion of the semiconductor substrate exposed at the bottom of the opening, toward the third impurity region formed by diffusing the impurity of the second conductivity type, because the surface portion of the semiconductor substrate wherein the third impurity region is formed is inclined substantially upward from the side of the element isolation insulator film to the sidewall of the opening, it is ensured that the impurity diffusing laterally to form the second impurity region reaches the third impurity region, and the second and third impurity regions are electrically connected easily to each other.

In addition, it is preferable that the portion of the sidewall of the opening exposing the third impurity region is tapered to be wider upward.

With this, because the length along the sidewall from the surface (upper surface) position of the semiconductor substrate to the bottom of the opening in the portion of the semiconductor substrate exposed at the sidewall of the opening becomes longer than that in the opening without tapered sidewall, the impurity introduced from the upper surface of the semiconductor substrate to form the third impurity region is less diffused to the portion of the semiconductor substrate located on the bottom of the opening. As a result, the decrease in the breakdown voltage between the first and third impurity regions can certainly be prevented. At the same time, because the impurity concentration of the second impurity region (intrinsic base diffusion layer) located around the first impurity region is not affected by the distance between the third impurity region (external base diffusion layer) and the first impurity region depending on the size of the bipolar transistor, variation in the injection efficiency of electrons in the portion around the first impurity region decreases, and variation in current gain hFE can be suppressed.

Furthermore, as the first and third impurity regions get close to each other if the impurity region to form the third impurity region is diffused to the region of the semiconductor substrate located on the bottom of the opening, it is preferable that a depth of a lower end of the third impurity region on the sidewall of the opening is substantially equal to or smaller than that of the bottom of the opening, to substantially prevent the first and third impurity regions from getting close to each other.

With this, the variation in the injection efficiency of electrons in the portion around the first impurity region can surely be reduced, and the variation in current gain hFE can certainly be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

A method of manufacturing a semiconductor device including a bipolar transistor according to the present invention will now be described.

Figure 1:
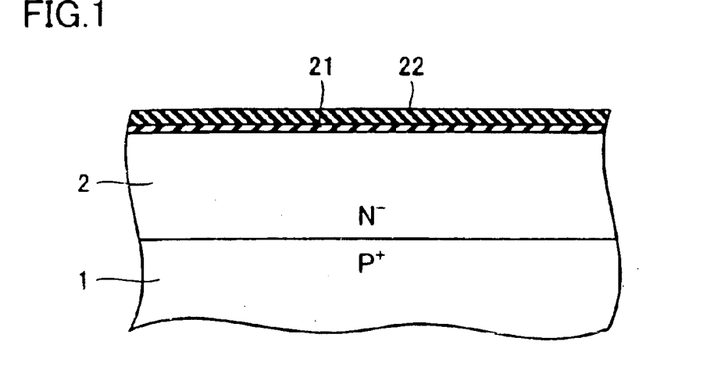
FIGS. 1–13 are cross-sectional views showing successive steps in a method of manufacturing a semiconductor device according to an embodiment of the present invention.

As shown in FIG. 1, an N⁻ epitaxial layer 2 is formed on a semiconductor substrate 1. A silicon oxide film 21 having a thickness of about 10–200 nm (100–2000 Å) is then formed by thermal oxidation of the surface of N⁻ epitaxial layer 2 at the temperature of about 800–1200° C. Thereafter, a silicon nitride film 22 having a thickness of about 10–300 nm (100–3000 Å) is formed with the CVD method.

Figure 2:
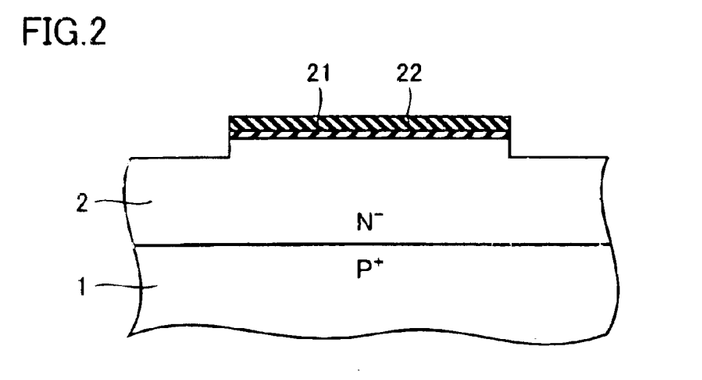

As shown in FIG. 2, while leaving portions of silicon oxide film 21 and silicon nitride film 22 located on a prescribed region wherein an element formation region is formed, portions of silicon oxide film 21 and silicon nitride film 22 located on the other region are removed by a prescribed photolithographic processing. Thereafter, a portion of N⁻ epitaxial layer 2 is removed by about 30–100 nm (300–1000 Å) from the surface by etching N⁻ epitaxial layer 2.

Figure 3:
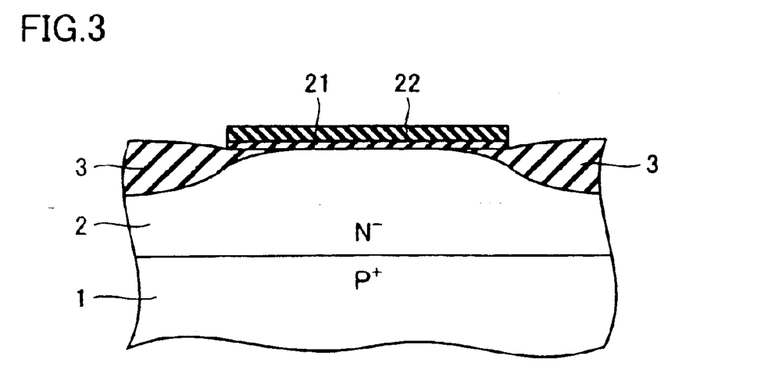

As shown in FIG. 3, a field oxide film 3 having a thickness of about 300–600 nm (3000–6000 Å) is then formed by thermal oxidation at the temperature of about 900–1200° C. In this step, the region of N⁻ epitaxial layer 2 located directly below the end portions of silicon oxide film 21 and silicon nitride film 22 is also oxidized, and thus field oxide film 3 is formed so as to penetrate into this region.

Figure 4:
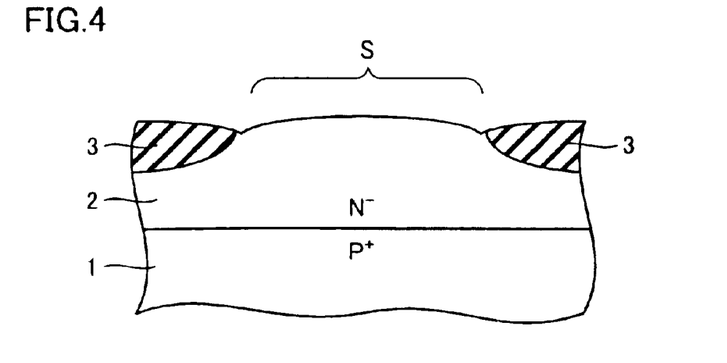

As shown in FIG. 4, the remaining silicon oxide film 21 and silicon nitride film 22 as well as a portion of field oxide film 3 having a certain thickness from the surface are removed by isotropic etching. With this step, an element formation region S separated by field oxide film 3 is formed. Element formation region S formed as such has a substantially convex surface shape curving upward from the end portion of field oxide film 3 to the center portion of element formation region S.

Figure 5:
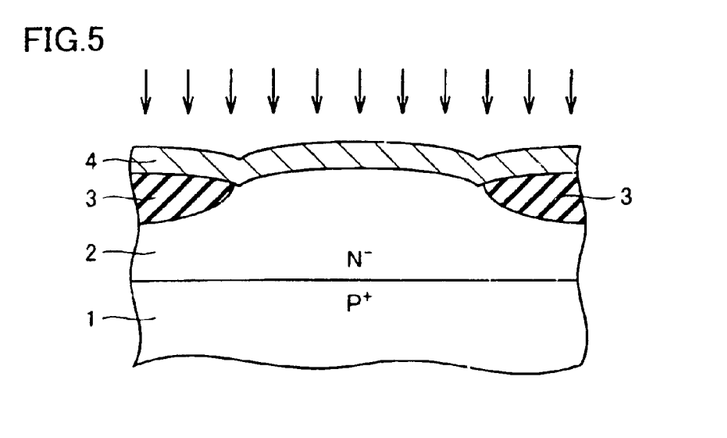

A polysilicon film having a thickness of about 100–400 nm (1000–4000 Å) is then formed on semiconductor substrate 1 with the CVD method. As shown in FIG. 5, a prescribed impurity such as boron (B) or boron difluoride ($BF_2$) to form an external base diffusion layer is implanted into the polysilicon film under the condition of 20 KeV-50 KeV implant energy and $1\times10^{14}/cm^2$ to $1\times10^{16}/cm^2$ dose. An external base leading electrode 4 is formed by prescribed etching of the polysilicon film.

Figure 6:
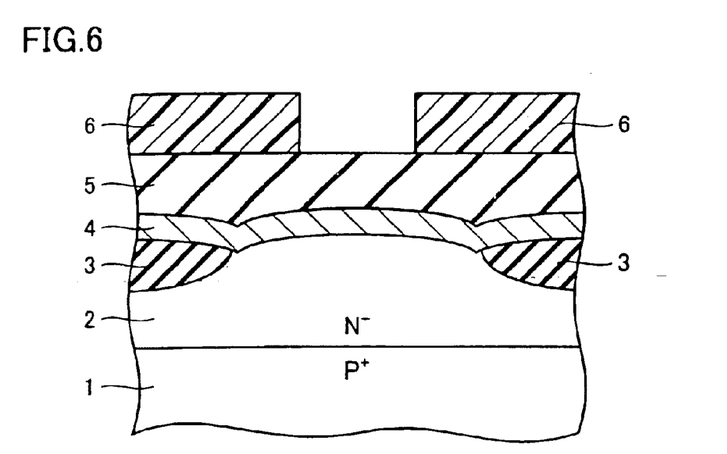
Figure 7:
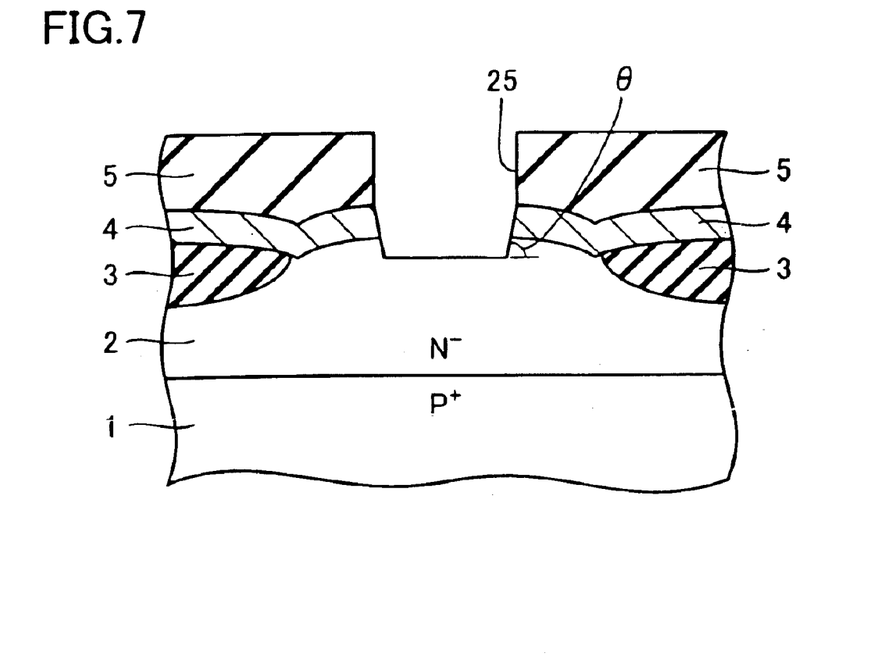

As shown in FIG. 6, a silicon oxide film 5 having a thickness of about 100–400 nm (1000–4000 Å) is then formed on semiconductor substrate 1 with the CVD method so as to cover external base leading electrode 4. A prescribed resist pattern 6 is formed on silicon oxide film 5, and an opening 25 as shown in FIG. 7 is formed by etching using resist pattern 6 as a mask.

In this step, anisotropic etching of silicon oxide film 5 is first performed, and then anisotropic etching of external base leading electrode 4 is performed using bromic etching gas, for example.

Opening 25 is tapered in a portion where external base leading electrode 4 is located because, during the etching step of external base leading electrode 4, reaction product of the etching adheres to the exposed surface of external base leading electrode 4.

After the portion of external base leading electrode 4 is removed, anisotropic etching of N⁻ epitaxial layer 2 is performed using etching gas such as $SF_6$ with an etching rate of semiconductor substrate (silicon substrate) 1 being set higher than that of the polysilicon film forming external base leading electrode 4.

With this, opening 25 is also tapered in a portion where N⁻ epitaxial layer 2 is located. An angle θ of the tapered portion formed in opening 25 is desirably equal to or larger than about 45° (and smaller than 90°).

Figure 8:
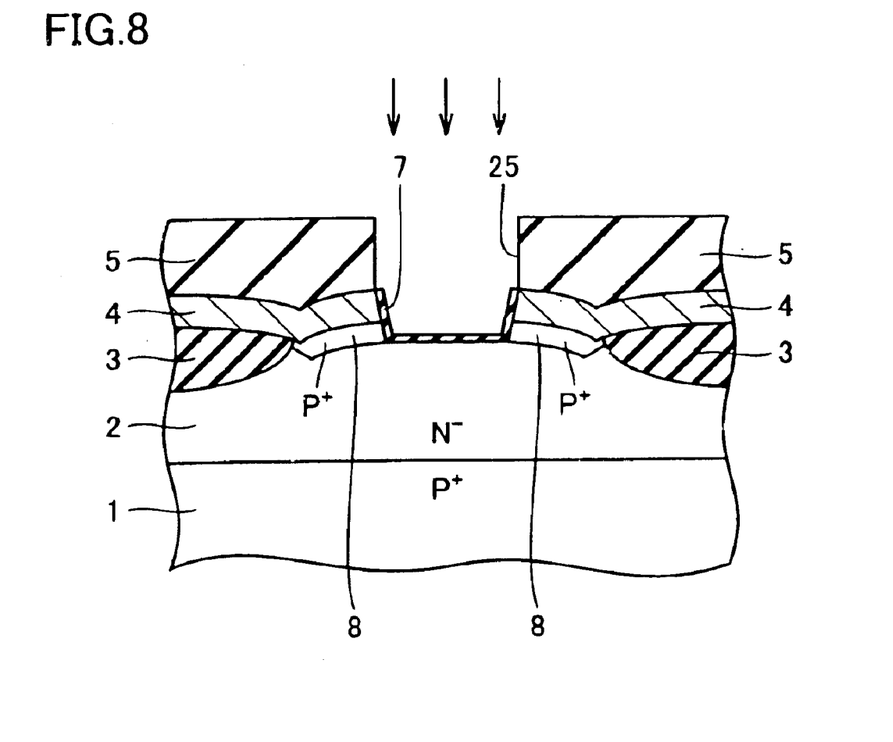

As shown in FIG. 8, an external base diffusion layer 8 is formed by performing oxidation for about an hour under a temperature of 800–900° C., for example, to diffuse boron or the like implanted into external base leading electrode 4 from the surface of N⁻ epitaxial layer 2 to the inside. In this step, a relatively thin silicon oxide film 7 is formed on the exposed surface of N⁻ epitaxial layer 2 and the like. In addition, it is desirable in this step to diffuse boron or the like which is diffused from the surface of N⁻ epitaxial layer 2 along the sidewall of opening 25 to an intermediate position (depth) of the sidewall, and not to the region of N⁻ epitaxial layer 2 located on the bottom of opening 25.

Then, boron (B), boron difluoride ($BF_2$) or the like is implanted into N⁻ epitaxial layer 2 under the condition of 20 KeV-50 KeV implant energy and $1\times10^{13}/cm^2$ to $1\times10^{15}/cm^2$ dose. This implantation links external base diffusion layer 8 and an intrinsic base diffusion layer which will be formed afterward as a link base implantation. A silicon oxide film (not shown) having a thickness of about 200–400 nm (2000–4000 Å) is then formed on silicon oxide film 5 with the CVD method.

Figure 9:
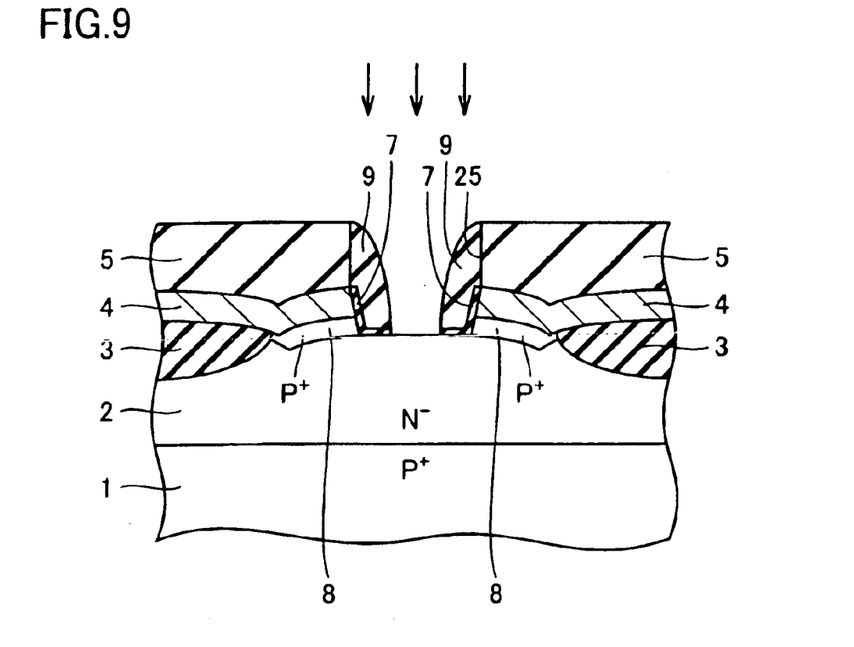

As shown in FIG. 9, a sidewall oxide film 9 is formed by performing anisotropic etching (etch back) of the silicon oxide film to expose the surface of N⁻ epitaxial layer 2. Then, impurity to form an intrinsic base diffusion layer such as boron (B) or boron difluoride ($BF_2$) is implanted into semiconductor substrate 1 as an intrinsic base implantation under the condition of 20 KeV-50 KeV implant energy and $1\times10^{14}/cm^2$ to $1\times10^{16}/cm^2$ dose.

Figure 10:
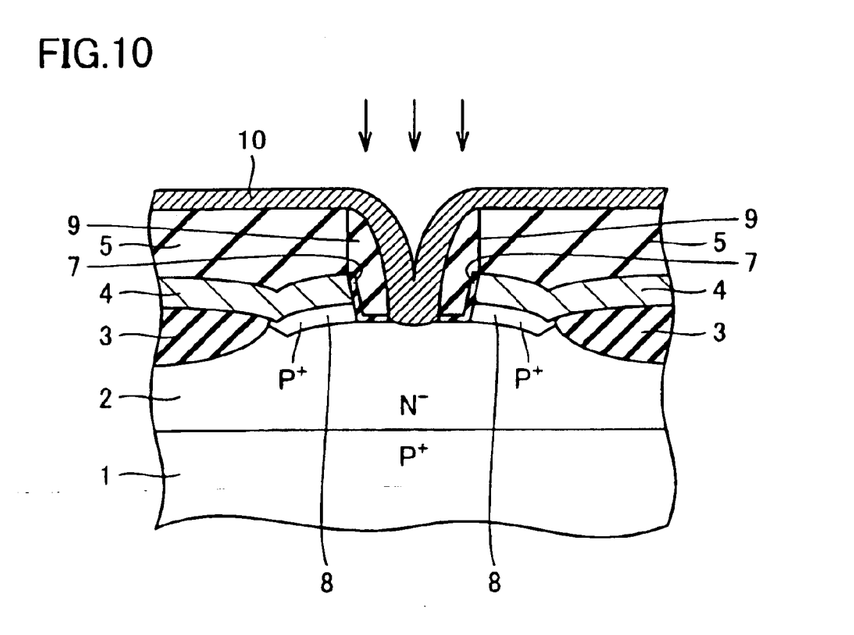

As shown in FIG. 10, a polysilicon film 10 having a thickness of about 100–400 nm (1000–4000 Å) is then formed on silicon oxide film 5 with the CVD method. Thereafter, a prescribed impurity to form an emitter diffusion layer such as arsenic (As) or phosphorus (P) is implanted into polysilicon film 10 as an emitter implantation under the condition of 30 KeV-60 KeV implant energy and $1\times10^{15}/cm^2$ to $1\times10^{16}/cm^2$ dose.

Figure 11:
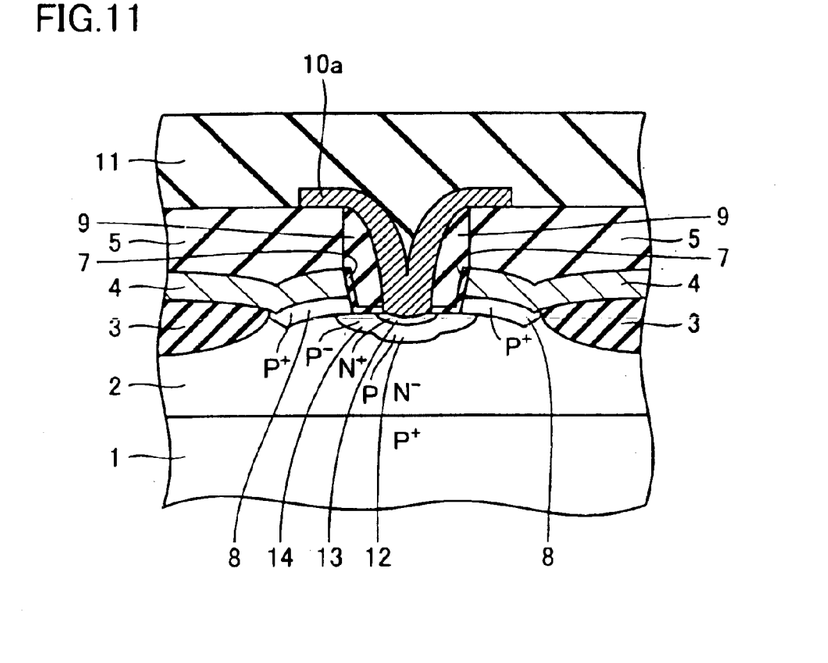

As shown in FIG. 11, an emitter leading electrode 10a is formed by a prescribed patterning of polysilicon film 10. An interlayer silicon oxide film 11 having a thickness of about 300–1000 nm (3000–10000 Å) is formed with the CVD method so as to cover emitter leading electrode 10a.

Thereafter, an intrinsic base diffusion layer 12 is formed by performing a heat treatment for about an hour under a temperature of 800–900° C., for example, to diffuse boron or the like implanted, as the intrinsic base implantation. In addition, boron or the like implanted as the link base implantation is diffused to form a link base diffusion layer 14, and external base diffusion layer 8 and intrinsic base diffusion layer 12 are linked to each other. Further, arsenic or the like implanted as the emitter implantation is diffused to form an emitter diffusion layer 13.

Figure 12:
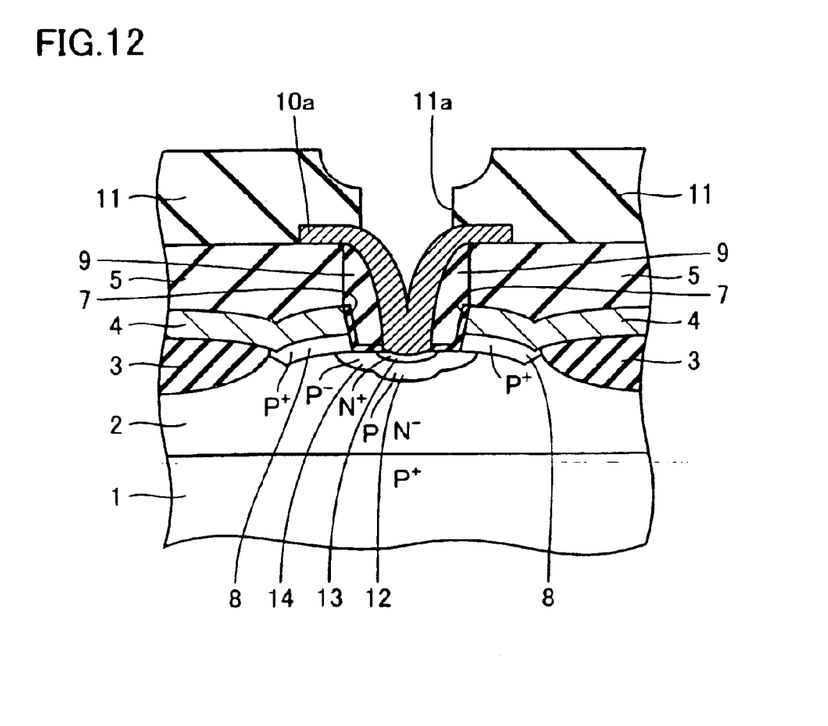

As shown in FIG. 12, a contact hole 11a exposing the surface of emitter leading electrode 10a is formed by performing prescribed photolithographic processing and etching of interlayer silicon oxide film 11. In this step, contact holes (not shown) respectively exposing the surfaces of N⁻ epitaxial layer 2 and external base leading electrode 4 are also formed. Then, an aluminum film (not shown) is formed by sputtering, for example, to fill contact hole 11a and the like.

Figure 13:
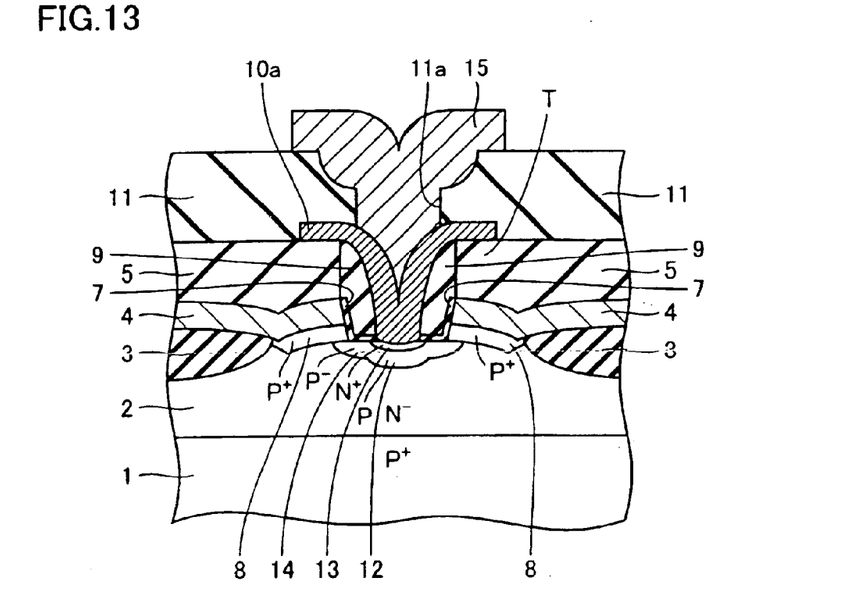

As shown in FIG. 13, an emitter electrode 15 connected to emitter leading electrode 10a is formed by a prescribed patterning of the aluminum film. In this step, a collector electrode (not shown) connected to N⁻ epitaxial layer 2 and a base electrode (not shown) connected to external base leading electrode 4 are also formed.

With this method, a semiconductor device including bipolar transistor T in element formation region S is formed.

In the manufacturing method described above, the portion of field oxide film 3 exposed around silicon oxide film 21 and the like is also isotropically etched when element formation region S is formed by removing silicon oxide film 21 and silicon nitride film 22 in the step shown in FIG. 4, and position of the surface of field oxide film 3 is lowered. Therefore, element formation region S comes to have a convex surface shape curving upward from the end portion of field oxide film 3 to the center portion of element formation region S.

In the step shown in FIG. 7, opening 25 is formed exposing the portion of element formation region S near its center, and the surface portion of N⁻ epitaxial layer 2 within element formation region S is inclined upward from field oxide film 3 to the sidewall of opening 25.

Therefore, when the impurity implanted into external base leading electrode 4 is diffused to form external base diffusion layer 8 in the step shown in FIG. 8, the impurity is diffused from the surface of inclined N⁻ epitaxial layer 2 to the inside.

As a result, external base diffusion layer 8 is formed along the surface of N⁻ epitaxial layer 2 and is inclined upward from field oxide film 3 to the sidewall of opening 25.

Figure 14:
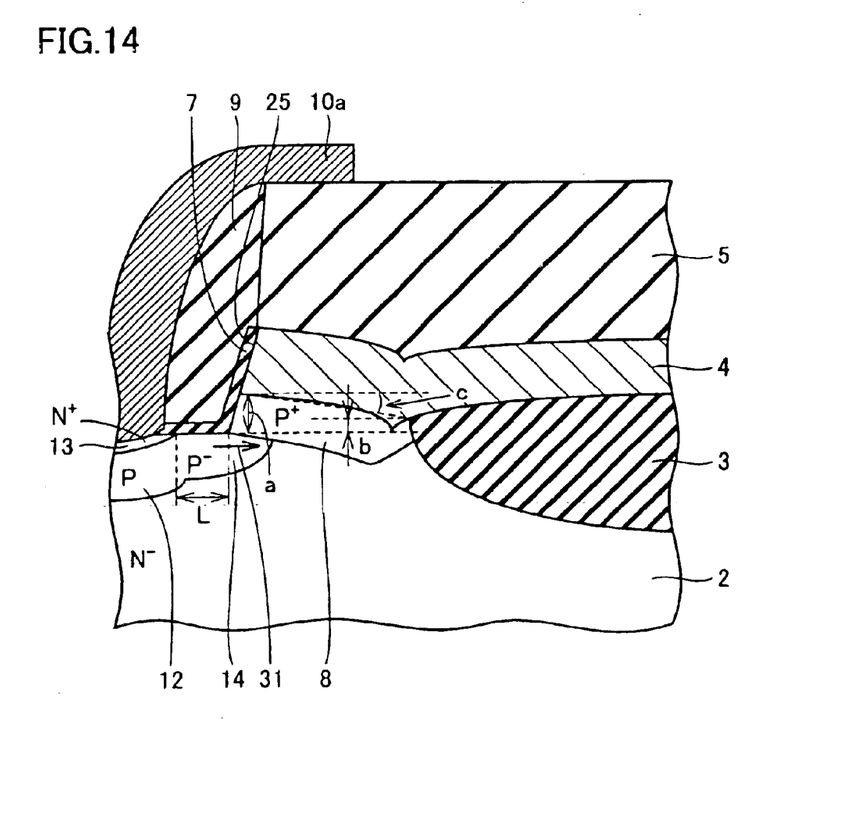
FIG. 14 is a partial enlarged-cross-sectional view of the semiconductor device in accordance with the invention.

As shown in FIG. 14, in external base diffusion layer 8 formed as such, when a position of the lower end of external base diffusion layer 8 on the side of opening 25 is defined as a reference position, a length a which is a height (vertical length) from the reference position to the upper end on the side of opening 25 is longer than a length b which is a vertical length from the reference position to the upper end on the side of field oxide film 3. An angle of inclination c is about 15–30°.

Because external base diffusion layer 8 is inclined upward from the side of field oxide film 3 to the sidewall of opening 25, the impurity diffused in a lateral direction (substantially horizontal direction) as indicated by an arrow 31 easily reaches the lower end portion of external base diffusion layer 8 when the impurity implanted as the link base implantation is diffused (FIG. 11).

In addition, as the portion of the sidewall of opening 25 exposing external base diffusion layer 8 (N⁻ epitaxial layer 2) is tapered, the impurity for the link base implantation can be implanted in a self-aligned manner to external base diffusion layer 8 located on this portion.

As a result, it is ensured that intrinsic base diffusion layer 12 and external base diffusion layer 8 are linked via link base diffusion layer 14, and characteristics of a bipolar transistor are stabilized.

In addition, because the portion of the sidewall of opening 25 exposing N⁻ epitaxial layer 2 is tapered, the length along the sidewall from the surface (upper surface) position of N⁻ epitaxial layer 2 to the bottom of opening 25 in the portion of N⁻ epitaxial layer 2 exposed at the sidewall of opening 25 becomes longer than that in the opening without tapered sidewall. Therefore, diffusion of the impurity, which impurity is diffused along the sidewall of opening 25 to form the external base diffusion layer, to the region of N⁻ epitaxial layer 2 located on the bottom of opening 25 is reduced.

With this, as a depth of the lower end of external base diffusion layer 8 on the sidewall of opening 25 becomes substantially equal to or smaller than that of the bottom of opening 25, emitter diffusion layer 13 and external base diffusion layer 8 are prevented from substantially getting close to each other as in the conventional semiconductor device.

As a result, decrease in the breakdown voltage between the emitter and base in the bipolar transistor can be prevented. Furthermore, because the impurity concentration of intrinsic base diffusion layer 12 located around emitter diffusion layer 13 is not affected by the distance between external base diffusion layer 8 and emitter diffusion layer 13 depending on the size of the bipolar transistor, variation in the injection efficiency of electrons in the portion around emitter diffusion layer 13 is reduced, and variation in current gain hFE is suppressed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a semiconductor substrate of a second conductivity type and having a main surface;
   an epitaxial semiconductor layer of a first conductivity type, opposite the second conductivity type, and disposed on said main surface of said semiconductor substrate, said epitaxial semiconductor layer having a surface;
   an element formation region on the surface of said epitaxial semiconductor layer and bounded by an edge of an element isolation insulating film on said epitaxial semiconductor layer, said element isolation film having a surface;
   an insulating film covering said element formation region;
   an opening in said insulating film in said element formation region, the opening having a sidewall and a bottom exposing a region of said epitaxial semiconductor layer located approximately centrally in said element formation region;
   a first conductive material between said epitaxial semiconductor layer and said insulating film, extending on said surface of and from said edge of said element isolation insulating film to the opening and exposed at said sidewall of the opening;
   a first impurity region of the first conductivity type at a portion of the surface of said epitaxial semiconductor layer exposed at said bottom of the opening;
   a second conductive material electrically connected to said first impurity region;
   a second impurity region of the second conductivity type in said epitaxial semiconductor layer, enclosing said first impurity region in said epitaxial semiconductor layer, and including a portion of the surface of said epitaxial semiconductor layer exposed at said bottom of the opening; and
   a third impurity region of the second conductivity type at a portion of the surface of said epitaxial semiconductor layer, within said element formation region, extending from said element isolation insulating film to the opening and exposed at said sidewall of the opening, and electrically connected to said second impurity region, wherein
   substantially all of the portion of the surface of said epitaxial semiconductor layer within said element formation region, extending from said edge of said element isolation insulating film to said sidewall of the opening is inclined relative to said main surface of said semiconductor substrate, and
   within said element formation region, the portion of the surface of said epitaxial semiconductor layer including said third impurity region and adjacent said sidewall is farther from said main surface of said semiconductor substrate than said surface of said element isolation insulating film that is most distant from said main surface of said semiconductor substrate.

2. The semiconductor device according to claim 1, wherein said third impurity region is inclined relative to said main surface of said semiconductor substrate and extends from said edge of said element isolation insulating film to said sidewall of the opening.

3. The semiconductor device according to claim 2, wherein a portion of said sidewall of said opening exposing said third impurity region is tapered and becomes wider with distance from said semiconductor substrate.

4. The semiconductor device according to claim 3, wherein a lower end of said third impurity region on said sidewall of the opening has a depth substantially equal to or smaller than that of the opening.

5. The semiconductor device according to claim 2, wherein a lower end of said third impurity region on said sidewall of the opening has a depth substantially equal to or smaller than that of the opening.

6. The semiconductor device according to claim 1, wherein a portion of said sidewall of the opening exposing said third impurity region is tapered and becomes wider with distance from said main surface of said semiconductor substrate.

7. The semiconductor device according to claim 6, wherein a lower end of said third impurity region on said sidewall of the opening has a depth substantially equal to or smaller than that of the opening.

8. The semiconductor device according to claim 1, wherein a lower end of said third impurity region on said sidewall of the opening has a depth substantially equal to or smaller than that of the opening.

* * * * *